United States Patent [19]

Fierkens

[11] Patent Number: 5,155,901
[45] Date of Patent: Oct. 20, 1992

[54] INTEGRATED CIRCUIT LEAD FRAME POSITIONER APPARATUS AND METHOD

[76] Inventor: Richard H. J. Fierkens, Keurbeck 15, 6914 AE Herwen, Netherlands

[21] Appl. No.: 814,502

[22] Filed: Dec. 30, 1991

[51] Int. Cl.⁵ .................... H01R 43/00; B21D 45/00
[52] U.S. Cl. ..................................... 29/827; 72/427; 72/428; 140/105
[58] Field of Search ............. 29/827; 140/105; 72/427, 428

[56] References Cited

U.S. PATENT DOCUMENTS 4,627,159  12/1986  Waldner ........................ 29/827

FOREIGN PATENT DOCUMENTS 61-69158  4/1986  Japan ........................ 29/827
3-22467   1/1991  Japan ........................ 29/827
3-129863  6/1991  Japan ........................ 29/827

Primary Examiner—Carl J. Arbes
Attorney, Agent, or Firm—Harry M. Weiss

[57] ABSTRACT

An apparatus and method for precisely positioning an integrated circuit lead frame is disclosed. This apparatus includes a positioning post that cooperates with an index hole in the lead frame, and a lower spring finger. The index hole of the lead frame is placed over the positioning post, and the opposite or bottom side of the lead frame rests on the lower spring finger. An upper spring finger is then brought down on top of the lead frame, aligning with the lower spring finger. As the two spring fingers press against the lead frame, the deflection of the two spring fingers cause the lead frame to move slightly and causes the positioning post located in the index hole to function as a mechanical stop of the deflection movement of the lead frame thereby achieving a very accurate positioning of the lead frame.

4 Claims, 1 Drawing Sheet

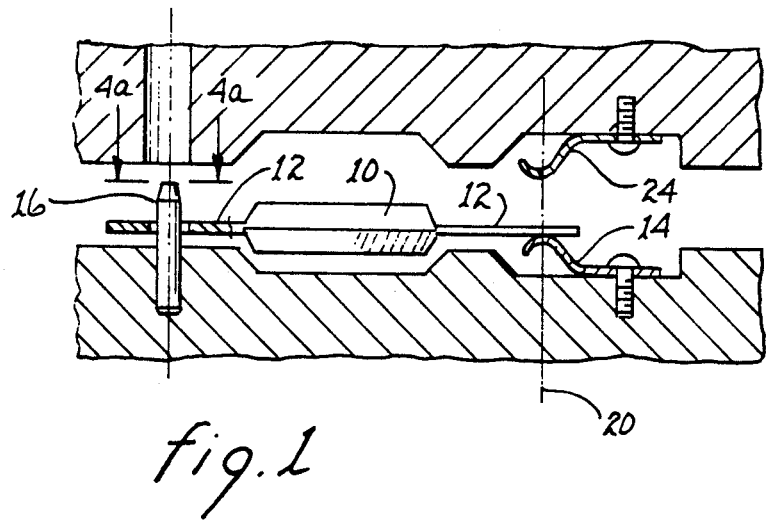
fig. 1
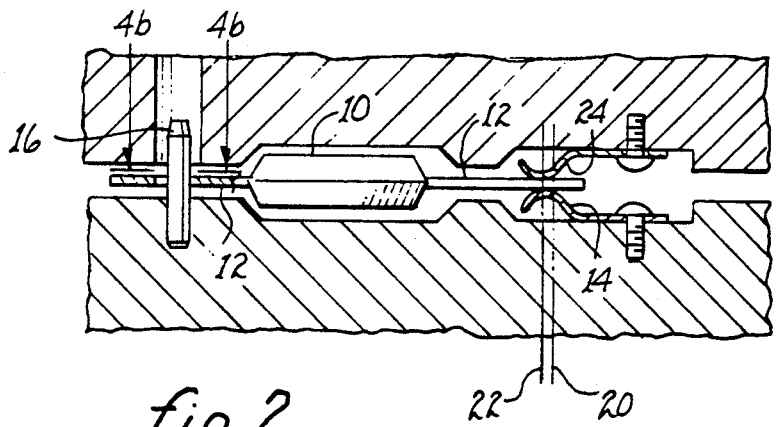
fig. 2
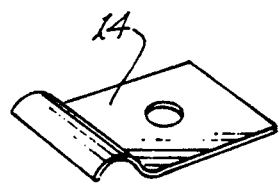
fig. 3
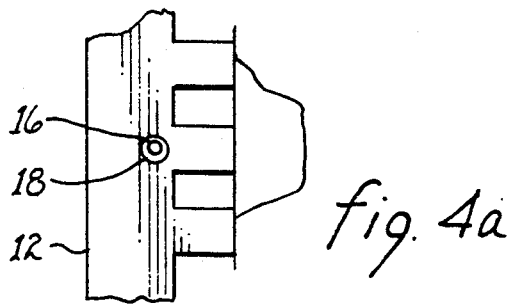
fig. 4a
fig. 4b
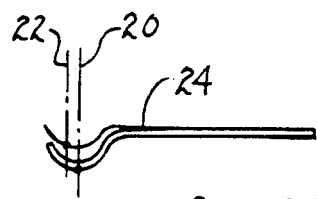
fig. 5
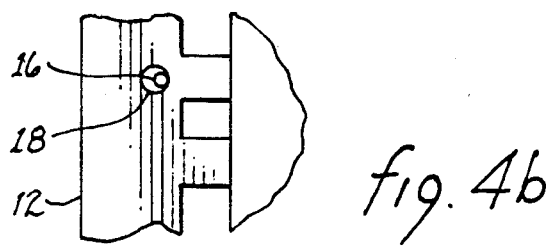

INTEGRATED CIRCUIT LEAD FRAME POSITIONER APPARATUS AND METHOD

FIELD OF THE INVENTION

This invention generally relates to semiconductor processing apparatus and methods, and more specifically relates to an integrated circuit lead frame positioner apparatus and method that is used to precisely position an integrated circuit lead frame for various different manufacturing processes.

DESCRIPTION OF THE PRIOR ART

Various different methods have been employed to position an integrated circuit lead frame during various manufacturing processes. The positioning methods of the prior art require additional time or processing steps to correctly position the integrated circuit lead frame, and many do not provide precise positioning required by many manufacturing processes.

Therefore, there existed a need to provide an integrated circuit lead frame positioner apparatus and method which can provide extremely accurate positioning of the integrated circuit lead frame automatically in a simple manner that requires no operator intervention.

SUMMARY OF THE INVENTION

It is an object of this invention to provide an integrated circuit lead frame positioner apparatus and method which provides extremely accurate positioning of the lead frame automatically, in a simple manner that requires no operator intervention.

According to the present invention, an integrated circuit with lead frame is provided. The lead frame has an index hole for precisely positioning the lead frame with the apparatus of the present invention. The index hole in the lead frame is placed over a positioning post which is substantially smaller in diameter than the diameter of the index hole. The side of the lead frame opposite the index hole rests on a spring finger. A top portion of the apparatus has a spring finger identical to the one upon which the lead frame is placed. As the top portion of the apparatus is brought into the proper position relative to the bottom portion and to the lead frame, the lead frame is pinched between the two spring fingers before the top portion is properly seated. As the top portion travels the remaining distance to its proper position, the two spring fingers move the lead frame slightly until the side of the index hole contacts the positioning post. The circular shape of the positioning post and index hole cause the lead frame to move as needed until the circular index hole and circular positioning post touch, at which point the lead frame is very precisely positioned, and ready for processing.

BRIEF DESCRIPTION OF THE DRAWINGS

FIG. 1 is a cross-sectional view of the apparatus of the present invention prior to positioning showing the lead frame to be processed, the lower apparatus portion, the upper apparatus portion, the two spring fingers, and the positioning post.

FIG. 2 is a cross-sectional view of the apparatus shown in FIG. 1 after positioning, showing how the action of the spring fingers pushes the lead frame against the positioning post.

FIG. 3 is a perspective view of one of the two identical spring fingers shown in FIGS. 1 and 2.

FIG. 4a is a top view of the integrated circuit lead frame prior to positioning with the index hole and positioning post of FIG. 1 taken along line 4a–4a.

FIG. 4b is a top view of the integrated circuit lead frame after positioning with the index hole and positioning post of FIG. 2 taken along line 4b—4b.

FIG. 5 is a side view of the upper spring finger shown in FIGS. 1 and 2, showing how the depression of the spring finger moves the lead frame into position.

DESCRIPTION OF THE PREFERRED EMBODIMENT

The apparatus of the present invention provides a method of precisely positioning an integrated circuit lead frame for various different manufacturing processes. As shown in FIG. 1, an integrated circuit 10 with associated lead frame 12 is shown, with one side of the lead frame 12 placed on lower spring finger 14, and the other side of the lead frame 12 placed over positioning post 16. As shown in FIGS. 4a and 4b, lead frame 12 has an index hole 18 which is placed over positioning post 16. As is shown in FIG. 4a, the difference in diameters of the index hole 18 and positioning post 16 allow for some movement and play in the positioning of lead frame 12. FIGS. 1 and 4a correspond to the lead frame prior to proper positioning. As shown in FIG. 2, upper spring finger 24 is moved down until it contacts the lead frame 12. At this point the lead frame is in position 20 as shown. As the upper spring finger 24 continues to move toward lower spring finger 14, both upper spring finger 24 and lower spring finger 14 deflect, causing lead frame 20 to move to position 22 as shown.

This movement of lead frame 12 from position 20 to position 22 causes the index hole 18 to press against positioning post 16 as shown in FIG. 4b. With the index hole 18 positioned with respect to positioning post 16 as shown in FIG. 4b, the lead frame 12 is accurately positioned and ready for the manufacturing process step that can benefit from this accurate positioning.

FIG. 3 shows the preferred configuration of lower spring finger 14. Upper spring finger 24 (see FIGS. 1, 2 and 5) is preferably identical to lower spring finger 14.

FIG. 5 shows in greater detail how the depression of upper spring finger 24 causes a linear movement of the contact point of the spring finger from position 20 to position 22.

While the invention has been described in its preferred embodiment, it is to be understood that the words which have been used are words of description rather than limitation, and that changes may be made within the purview of the appended claims without departing from the true scope and spirit of the invention in its broader aspects. For example, the mounting of the positioning post 16 and spring fingers 14 and 24 can vary as required by the specific process step to be performed. Proper positioning with this type of apparatus could be used in conjunction with a plastic encapsulation mold, with lead frame punching, or with a variety of other manufacturing steps or equipment. The specific implementation of the positioning system of the present invention may be modified to accommodate these varying requirements without departing from the scope of the present invention.

I claim:

1. A method for positioning an integrated circuit lead frame comprising the steps of:
    providing an integrated circuit package comprising, in combination:

a lead frame comprising a base portion having metal leads that extend from said base portion, and having an index hole for positioning said lead frame; and a semiconductor chip fixedly attached to said base portion of said lead frame and having bonding wires connecting portions of said semiconductor chip to said metal leads of said lead frame;

providing lower apparatus plate means for holding said integrated circuit package in place;

providing lower spring finger means fixedly coupled to said lower apparatus plate means for assisting in moving said integrated circuit package which is placed on said lower spring finger means;

providing a positioning post fixedly coupled to said lower apparatus plate means such that said positioning post passes through said index hole in said lead frame when said lead frame is correctly positioned on said lower spring finger means;

providing an upper apparatus plate which is positioned directly above said lower apparatus plate means; and providing upper spring finger means fixedly coupled to said upper apparatus plate for cooperating with said lower spring finger means to engage and move said lead frame, said upper spring finger means aligns with said lower spring finger means when said upper apparatus plate is positioned properly above said lower apparatus plate means such that said lead frame is pressed between said upper spring finger means and said lower spring finger means when said upper spring finger means and said lower spring finger means deflect as the upper apparatus plate is placed in the proper position above said lower apparatus plate means.

2. The method of claim 1 further comprising the steps of:

placing said integrated circuit package onto said lower apparatus plate means by placing said index hole in said lead frame over said positioning post, and placing the opposite side of said lead frame on top of said lower spring finger means; and moving said upper apparatus plate into position above said lower apparatus plate means, such that said lead frame is held between said upper spring finger means and said lower spring finger means, said upper spring finger means and said lower spring finger means deflecting as said upper apparatus plate is properly seated into place above said lower apparatus plate means to cause a slight movement of said lead frame, pressing a side of said index hole of said lead frame against said positioning post thereby acting as a stop for achieving a very precise positioning of said lead frame.

3. An integrated circuit lead frame positioner apparatus comprising, in combination:

an integrated circuit package comprising, in combination:

a lead frame comprising a base portion having metal leads that extend from said base portion, and having an index hole for positioning said lead frame; and a semiconductor chip fixedly attached to said base portion of said lead frame and having bonding wires connecting portions of said semiconductor chip to said metal leads of said lead frame;

lower apparatus plate means for holding said integrated circuit package in place;

lower spring finger means fixedly coupled to said lower apparatus plate means for assisting in moving said integrated circuit package which is placed on said lower spring finger means;

a positioning post fixedly coupled to said lower apparatus plate means such that said positioning post passes through said index hole in said lead frame when said lead frame is correctly positioned on said lower spring finger means;

an upper apparatus plate positioned directly above said lower apparatus plate means; and upper spring finger means fixedly coupled to said upper apparatus plate for cooperating with said lower spring finger means to engage and move said lead frame, said upper spring finger means aligns with said lower spring finger means when said upper apparatus plate is positioned properly above said lower apparatus plate means such that said lead frame is pressed between said upper spring finger means and said lower spring finger means when said upper spring finger means and said lower spring finger means deflect as the upper apparatus plate is placed in the proper position above said lower apparatus plate means.

4. The apparatus of claim 3 wherein said integrated circuit package further comprising means for surrounding and protecting said semiconductor chip and said base portion of said lead frame such that said metal leads of said lead frame extend to the exterior of said surrounding and protecting means.

* * * * *